MAGNETICALLY TUNED HIGH FREQUENCY CIRCUITS

Original Filed Dec. 31, 1935 2 Sheets-Sheet 1

INVENTOR.
Robert L. Harvey
BY J. S. Huff
ATTORNEYS.

MAGNETICALLY TUNED HIGH FREQUENCY CIRCUITS

Original Filed Dec. 31, 1935 2 Sheets-Sheet 2

INVENTOR.
Robert L. Harvey
BY J. Huff
ATTORNEYS.

Reissued May 26, 1942

Re. 22,103

UNITED STATES PATENT OFFICE 22,103

MAGNETICALLY TUNED HIGH FREQUENCY CIRCUITS

Robert L. Harvey, Collingswood, N. J., assignor to Radio Corporation of America, a corporation of Delaware Original No. 2,180,413, dated November 21, 1939, Serial No. 113,468, November 30, 1936, which is a division of Serial No. 56,993, December 31, 1935. Application for reissue August 15, 1941, Serial No. 407,086

21 Claims. (Cl. 178—44)

My invention relates to high frequency communication tuning systems, and more particularly to adjustable magnetically tuned resonant circuits and inductors for operation at radio frequencies. This is a divisional of application S. N. 56,993, filed December 31, 1935. Heretofore it has been the practice in superheterodyne radio receivers to employ, in the intermediate frequency amplifier, a fixed inductor, air core type of transformer with a pair of semi-adjustable screw type condensers with mica dielectric, mounted on an insulated base, side by side, for tuning the primary and secondary coils respectively of said transformer. Such a structure is shown in De Tar Patent No. 2,047,360, issued July 14, 1936. Trouble has been experienced, after the receivers have been assembled and in use, with changes in frequency adjustment. Because of the fact that intermediate frequency transformers must be precisely tuned to a given fixed frequency, a slight change in the capacity of the condensers results in detuning of the frequency to an extent that necessitates realignment by a service man. Notwithstanding careful precautions in design, it appears to have been impossible to prevent such changes occurring in the tuning caused by warping of the plates, ageing of the dielectric, temperature and moisture changes, etc.

In the tuned radio frequency amplifiers, by way of additional example, it has been customary to accurately match up inductances of the coils in cascaded stages, tunable over a band of frequencies by means of a plurality of variable condensers ganged for single control, in accordance with the teachings of Giblin #1,842,937 patent. Various means have been used to vary the inductance of one or more of the coils in the matching process in production, one means in general use being the sliding of coil turns as disclosed in the De Tar Patent 1,860,176. An objection to the latter means has been that there is no way to conveniently vary the position of the turns, which have been cemented in place, e. g., by means of a simple tool, as in the case of trimmer condensers. Although this method has proven highly useful, a delicate hand operation is necessary. To provide structure for a screw driver type of adjustment, as by means of a variometer arrangement would entail considerable increase in expense without sufficient compensating advantages.

For many years it has been known that paramagnetic material operatively disposed in the field of an inductor used in radio frequency work produces certain desirable electrical advantages, provided the material is in such form and arrangement as to minimize energy consuming eddy current and hysteresis losses.

The most satisfactory cores for coils heretofore used in high frequency circuits have consisted of extremely finely divided or comminuted magnetic material, such as iron dust, held together with a suitable insulating binder. As an example of extreme fineness of subdivision, it has been considered necessary to use pure iron powder small enough to pass through a 300 mesh screen for use with inductors adapted for the broadcast frequency range of 550–1500 kilocycles. The cost of production of such finely divided material, as by chemical reduction of iron oxide, has been expensive, as well as the production of the finished molded core. It has been necessary, because of the low resistance of the iron, to provide that the particles shall be well insulated electrically from each other to reduce eddy current losses; in some cases the particles of pure iron, or alloy, have been oxidized, and in other cases an insulating powder has been mixed with the iron powder to minimize electrical contact among the particles.

The problem of manufacturing satisfactory cores for operation at radio frequencies is quite different from that of cores for audio frequency work. I am aware that iron oxide was proposed many years ago for loading coils in telephony, see Lee and Colpitts #705,935, but in recent years workers skilled in the art have apparently considered it necessary to go to the trouble and expense of providing pure iron or alloys and have actually taken oxide of iron and reduced it by various processes to pure iron. Whereas Lee and Colpitts disclosed that ferroso-ferric oxide ($Fe_3O_4$) was suitable for loading coils, they apparently considered it necessary to go to the trouble of producing it synthetically. Superficial tests with the ore magnetite would lead one skilled in the art to assume that the material is unsatisfactory, but after considerable research I have discovered ways and means whereby magnetite, inexpensive and rather plentiful, may be employed successfully for the purposes disclosed without changing chemically the form of the ore. For electrical reasons, as well, I prefer the natural magnetite.

It is, accordingly, an object of my invention to provide a novel and improved inductor tuned coupling unit for use in radio systems to improve the gain and selectivity of such systems, and factor of merit of circuits therein.

It is a further object of my invention to provide an improved magnetically tunable transformer or inductor for use in high frequency communication systems, which, by reason of its novel design, is substantially lower in cost and smaller in size, without a sacrifice in gain and selectivity relative to apparatus heretofore in general use.

A still further object of my invention is to provide an improved resonant coupling unit, avoiding the necessity for adjustable trimmer condensers, for use in the intermediate frequency amplifier of a superheterodyne radio receiver, which, by reason of its novel design, is substantially more stable in regard to the fixed frequency adjustment throughout the useful life of the receiver, notwithstanding changes in humidity, temperature, and age.

A still further object of my invention is to provide an improved magnetic core, and method of making same, which will have a high permeability and low core loss when disposed in a varying magnetic field set up by radio frequency currents.

More specifically, it is an object of my invention to provide an improved resonant coupling unit and radio chassis assembly, which, by reason of my novel design, is adapted to low cost production and is characterized by convenient tuning adjustment of the coupling unit in the assembly.

A still further object of my invention is to provide a radio frequency transformer with one or more adjustable permeable core structures for changing the self inductance of one or more of the transformer coils without materially changing the coupling coefficient between coils.

In accordance with my invention, the primary and secondary coils of an intermediate frequency transformer of a superheterodyne receiving system are shunted respectively by small fixed capacitors, although, in some cases, the capacitors are not used, and the coils are adjustably tuned to the desired intermediate frequency by moving molded cores of powdered magnetic material, preferably comminuated magnetite, in the fields respectively of the coils. By reason of my novel design, the transformer coils and the entire shielded coupling unit can be made substantially smaller than air core transformers for the same requirement as to factor of merit, or they can be made larger with a substantial improvement in the factor of merit. The result of using magnetite cores is to reduce the combined cost of the coils and capacitors more than the cost is increased by the addition of the iron cores.

Another advantage is the elimination of adjustable trimmer condensers, the electrical constants of which change considerably with humidity, temperature and aging.

A still further improvement is in lower loss tuned circuits (higher Q) which results in higher gain and greater selectivity per amplifier stage, which can be converted into still lower cost and smaller size by reducing the size of the shielding container until the circuit losses are the same as for the standard air core design.

Another advantage is that the weight of the coupling unit is substantially reduced, a reduction of 60% having occurred in certain units made in accordance with my invention. This is particularly advantageous for radio apparatus used on aircraft.

It is believed that the invention will be better understood from the following detailed description of certain embodiments of my invention and from the accompanying drawings in which Fig. 1 is a full sized side elevational view of a portion of radio chassis having mounted thereon radio apparatus of a superheterodyne system, made in accordance with my invention;

Figure 2:
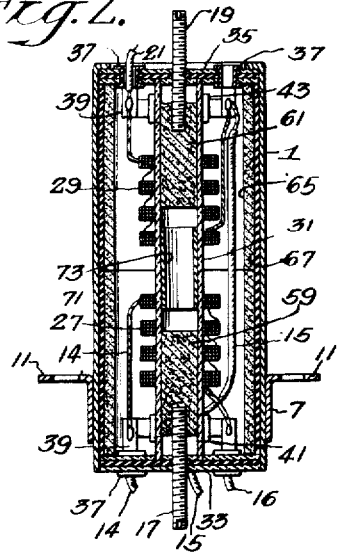
Fig. 2 is a side elevational view in section, drawn to scale, of an intermediate frequency transformer or coupling unit shown in Fig. 1.
Figure 9:
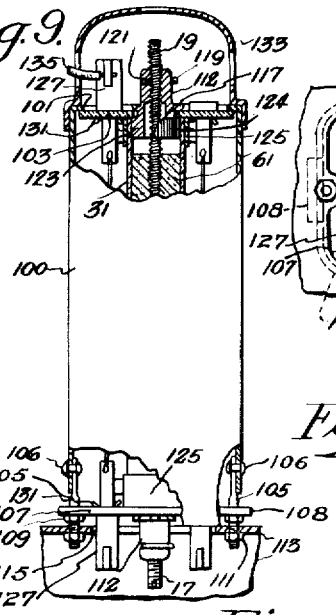
Fig. 9 is a modified and preferred form of an intermediate frequency transformer or coupling unit made in accordance with my invention.
Figure 13:
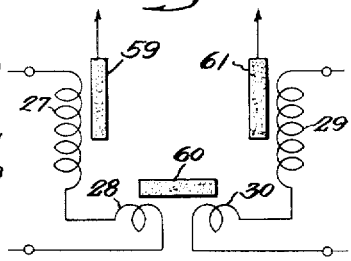
Figure 11:
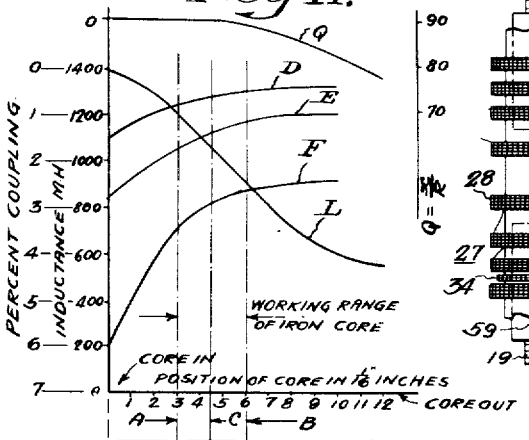
Fig. 11 represents characteristic curves of my improved apparatus.
Figure 12:
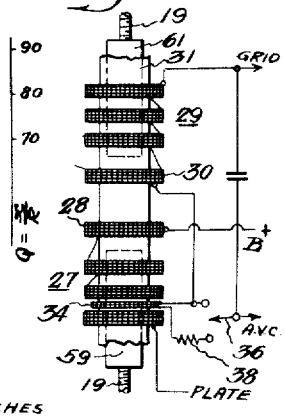
Figure 14:
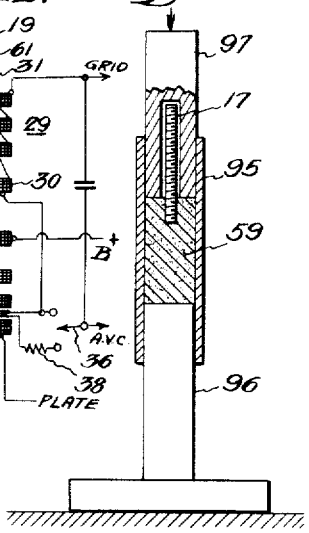
Figure 11A:
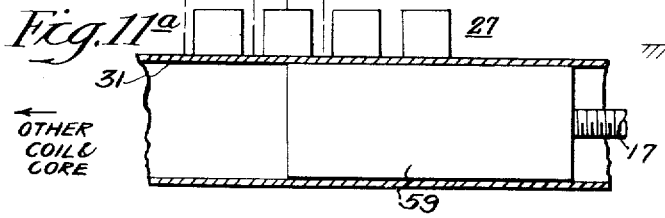

Fig. 11*a* is an enlarged view, partly in section, of the coil and core structure of the unit of Figs. 2 and 9 shown in functional relation to the curves of Fig. 11;

Fig. 12 is a view, in side elevation, of a slightly modified form of my invention, corresponding to the coil and core structures of Figs. 2 and 9;

Fig. 13 is a circuit diagram of a still further modification of my invention corresponding to Fig. 12 and illustrating an ideal development thereof; and Fig. 14 is a view, in side elevation, partly in section, of the molding device used in forming the molded magnetic material in accordance with my invention.

It will be understood, however, that these embodiments of my invention are merely illustrative and that the invention is not limited to these forms.

Referring to the drawings, an intermediate frequency coupling unit, housed in a shielding container 1 is mounted on the metal chassis 3 of a superheterodyne radio set, preferably with the unit extending through an opening 5 in the chassis. For the conservation of space, the lower portion of the unit extends below the surface of the chassis and is preferably mounted thereon by means of a clamp 7 which encircles the container 1 and is clamped thereto by means of a bolt and nut 9. The clamp is provided with a pair of horizontal flange portions 11 which are riveted to the chassis at 13 in a manner that will appear obvious. The unit may readily be removed for servicing by disconnecting the outer ends of leads 14, 15, 16 and loosening bolt 9. The coupling unit is provided with tuning adjustment screws 17 and 19 at its respective ends, below and above the surface of the chassis respectively. This provides a very convenient and accurate adjusting means, without the use of special tools, for purposes of convenient assembly as well as subsequent servicing, if necessary.

For the reduction of capacity coupling, one of the leads 21 from the unit is brought out from the top and is provided with a clip 23 adapted to engage the grid terminal of a vacuum tube 25, one of the new metal envelope small sized vacuum tubes (Radiotron type #6K7) being shown. By reason of my novel design, it will be noted that the size of the coupling unit, particularly that portion extending above the chassis, compares favorably with the size of the small vacuum tube. By way of example, the dimensions of the unit are 3 1/16" long by 1 3/8" in diameter, as compared to 5" x 1 7/8" for the usual air core transformer design. The weight of the new unit is 0.1 lb. as against 0.25 lb. for the air core design.

Referring more in detail to the interior of the coupling unit, as shown in Fig. 2, the transformer consists of universal sectional wound primary and secondary coils 27 and 29 fixedly mounted on a sleeve 31 of insulating material such as fiber tubing. The tubing is concentrically mounted within the shield container 1 by means of the end closing plates 33 and 35 respectively. The end plates are provided with eyelets 37 from which depend terminals 39 which in turn support and electrically connect condensers 41 and 43 respectively. The terminal leads of the coils 27 and 29 are also electrically attached to these terminals 39.

Figure 8:
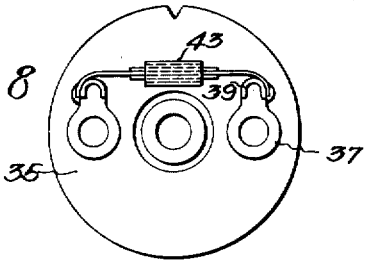
Fig. 8 is an enlarged plan view of the element shown in section in Fig. 7.
Figure 7:
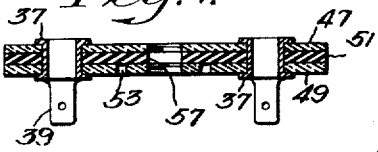
Fig. 7 is an enlarged cross sectional view of an element of the coupling unit shown in Fig. 2.

Referring more in detail to Figs 7 and 8, the end plates each consist of a pair of discs 47 and 49, preferably of laminated synthetic phenol resin material, or any other suitable insulating, with a sheet of rubber 51 cemented therebetween. This unit is assembled by applying adhesive material between adjacent surfaces and by applying pressure. For the purpose of retaining the ends of the tubular sleeve 31, one of the plate sections 49 is provided with a circular slot 53 into which an end of the sleeve 31 is adapted to snugly fit. The function of the rubber sheet 51 is to frictionally grip the adjusting screws 17 and 19 at the threaded bore 57 for insuring against lost motion. The bores 57 in the end plates are threaded, as by a self tapping action by the screws 17 and 19 respectively. The rubber sheet also frictionally grips the coil tubing and prevents turning while adjusting the core.

Referring back to Fig. 2, the transformer coils 27 and 29 are provided with adjustable cores 59 and 61, respectively, disposed in sliding relation within the bore of the tube 31. The cores consist preferably of 2 granular magnetite ore. This material, as sifted natural sized sand particles or as granules crushed from larger sized pieces of ore, is mixed with an insulating binder, preferably phenol condensation resin, known as "Bakelite", cold-molded under moderate pressure, and cured under moderate temperature, the adjusting screws 17 and 19 respectively being mounted in the ends of the cylindrical cores 59 and 61 respectively.

Referring again to Fig. 2. I have shown an inner-lining 65 for the shielding container, preferably of the same molded magnetic material as in the cores. This innerliner may be molded in sections, two sections being shown in the drawings and assembled into the container, and separated therefrom by a thin sheet of insulating material 67, if desired. The insulation may be omitted and the innerliner cemented in the container. The effect of the molded shielding innerliners is to effectively reduce the reactive effect of the shielding container upon the coils. This advantage can be used to improve the efficiency or factor of merit of the coils with a given construction, or can be used to make possible a substantially smaller overall construction of coupling unit, with the same efficiency as before.

Further, by way of example, the following specifications are given of an intermediate frequency coupling transformer made in accordance with my invention and adapted to operate at 460 kc., although the data is based on a design omitting the shielding innerliner 67, as in Fig. 9, later described. The coils 27 and 29 are each wound with single silk enamel five strand #40 litz wire in four sections on a ten mil fiber tube 31, 3/8" inside diameter and 3" long. Each coil is wound in four sections, it having been found that this number gives better practical design than three or five sections, for reducing capacity and for obtaining other advantages hereinafter described. There are 75 turns of wire per coil section, in eight layers, wound 1/8" wide with 1/16" spacing between sections, and 1/2" between inner sections, respectively, of primary and secondary. The iron cores are 23/64" in diameter and 3/4" long with a 6/32" brass screw 17, 3/4" long inserted 3/16" into the end of the cores. The coil inductances, without magnetite core, and the fixed capacities should be held to present day production tolerances of ± 5%. The cores can be held to an effective inductance tolerance of ± 1%. With these tolerances provision is desirably made for adjusting the cores to give an inductance change of each coil of around plus and minus 15%.

The cores in the drawings are shown in about the normal intended operating position. It is desirable that the circuit constants be made such that it is not necessary to insert the cores into the support sleeve 31 a distance farther than about mid-way between the innermost adjacent two sections of each of the transformer windings respectively. I have found, in accordance with my invention, that the cores may be adjusted to this position, which I will call the maximum position, to vary the self inductance of each coil without materially changing the coefficient of coupling between primary and secondary. This coupling is largely determined by the inner adjacent sections, respectively, of primary and secondary coils, discussed more fully in connection with Fig. 11*a*. In order to insure against travel of the cores beyond this point, various limiting structures may be employed if desirable, although I have shown an inner sleeve 73 of reduced diameter secured within the sleeve 31 as by any suitable cementing material. Screws 17 and 19 may, if desired, be reduced in length and amount that will limit the travel to the maximum position.

The reason for the avoidance of variable coupling between primary and secondary with different positions of the cores, is that production difficulties are avoided. It is intended that movement of the cores vary only the self inductances, respectively, in order to adjust the resonant point of the tuned circuits. The coupling is determined mainly by the relative spacing of primary and secondary coils on the support sleeve 31 under given conditions of design of the surrounding shield container. For production this coupling is readily predetermined and it is desired that it be a fixed quantity. It can be seen that any change in individual units of this coupling, and resulting change in selectivity, would quite seriously upset this uniformity of production. In other words, the cores should never extend into the two adjacent primary and secondary coil sections which have the greatest mutual inductance between them.

Curve L in Fig. 11 shows the relation of core position with respect to either one of the coils of Fig. 2 and the resulting self inductance. Coil 21, enlarged in form, is chosen by way of example, in associated Fig. 11. Figs. 11 and 11*a* are drawn to line up so that the core positions plotted as abscissa in Fig. 11 correspond to the physical relations in Fig. 11*a*. With the ¾" core in the maximum position, the inductance is shown to be 1380 microhenries, whereas with the core removed, the inductance is found to be 530 microhenries. The effective permeability of the core in maximum postion is about 2.6. With a one inch length core, the effective permeability was about 3.

As indicated in Fig. 11*a*, the core should not extend to the left further than the position marked A, the working range being chosen between points A and B. One reason for this will be seen by referred to curves D, E and F, plotted between percent coupling between primary and secondary, and the positions of each core, the different curves representing different spacings between primary and secondary. The primary and secondary cores were shifted equally for each reading. Curve D represents a spacing between innermost sections of respective coils of ⅝", curve E a spacing of ½", and curve F a spacing of ⅜". The measurements were taken at a frequency of 1000 cycles.

The curves show how critical the spacing is. Curve D shows that a quite flat coupling curve for the working range may be obtained with a spacing of ⅝". In the structure of Fig. 2, however, a spacing of ½" was used, the curve E indicating that the results were satisfactory. Curve F shows that with close spacing between innermost sections of the transformer windings, the percent coupling varied to a greater degree, and to an undesirable degree in the region to the left of the working range.

Allowing for liberal production tolerances of the various elements, the core positions for resonance will lie between points A and B, the desired working range of the iron core, a core travel of about $\frac{3}{16}$" with the average position at C. In other words, the end of the core is adapted to move between opposite ends of the next to the innermost coil section. This adjustment will give an inductance of about 1060 microhenries (plus and minus 15%), and an average effective permeability of two. Referring to Curve Q, it has been found that in the same L/C ratio, the Q or factor of merit, and consequently the gain and selectivity, does not increase appreciably as the core is moved inwardly beyond the mid-point of the coil (point B); the Q rises from seventy-eight, core out, to eighty-nine, with core halfway in the coil (point B), and to only ninety-one with iron core in the maximum effective permeability position (point A). This may be accounted for by increased distributed capacity and losses due to the presence of the core. The core and shield material employed in the above examples, is an iron oxide ore sometimes called "lodestone", and consists chemically of one part FeO and two parts $Fe_2O_3$. The natural ore is ground, and/or sifted, to the required granular size and magnetically separated from silica and other foreign material. According to "Dictionary of Applied Chemistry," Thorpe, vol. 13, 1912 edition, page 378, the following definitions are given:

"Magnetite, or Magnetic Iron-Ore.—A mineral of the spinel group, consisting of magnetic oxide of iron, $Fe_3O_4$ or $FeO.Fe_2O_3$; an important ore of iron (Fe 72.4 p. c.). Sharply developed crystals with bright faces are not uncommon; these belong to the cubic system and usually have the form of the regular octahedron or the rhombic-dodecahedron. Granular to compact masses are, however, more abundant. The colour is iron-black with a dull, submetallic lustre and a black streak. Sp. gr. 5.18; hardness 6. The mineral may be always readily recognized by its strong magnetic character; small fragments are picked up by a magnetized knife-blade. Only occasionally are specimens magnetic with polarity (v. loadstone). As small grains and crystals, magnetite is of wide distribution in many kinds of igneous rocks, especially the darker coloured with a low silica percentage. In such rocks it sometimes forms rich segregations available for mining; as in the Ural Mountains and at Kirunavara and Gellivara in Swedish Lapland. Other important deposits, e. g., some of those in southern Sweden and Norway, have been formed by the metamorphism of pre-existing iron-ores, where they have been subjected to the baking action of intrusive masses of igneous rock. Extensive deposits of magnetite are also mined in the crystal line Archaean rocks of the Adirondack region of New York and in Canada." "Inorganic and Therostical Chemistry" by Mellor, vol. 8, part 2, page 732. ". . . magnetite exhibits a wide variation in composition, for the extremes in 30 analyses were:

| | Fe as FeO | Fe as $Fe_2O_3$ | FeO; $Fe_2O_3$ |
|---|---|---|---|
| Magnetite (ideal) | 24.11 | 48.29 | 1:2.00 |
| Octahedra from Vogelsberg | 39.85 | 15.22 | 1:0.38 |
| Sheperd Mt., Missouri | 1.36 | 63.95 | 1:47.02" |

By commercial analysis I have found that the magnetite giving best results comes from the Adirondacks and is the "ideal" compound as listed in Mellor and described as $Fe_3O_4$ or FeO, $Fe_2O_3$ (Fe 72.4%) in Thorpe. ' It is noted that the reference "Fe 72.4%" in Thorpe (which is the percentage of iron by atomic weight) is the same as the combined iron percentage in Mellor, i. e., 24.11+48.29=72.4%. The ratio of Fe as in FeO and Fe as in $Fe_2O_3$ is 1:2. The ratio by weight of FeO to $Fe_2O_3$ is about 31:69.

*Magnetite particles size.*—The required fineness of magnetite particles is determined by: First, desired permeability and permissible loss (the finer particle cores have lower loss but lower permeability); secondly, mechanical strength and appearance (finer particles will make stronger and smoother surface cores). As between permeability and losses, there is an optimum compromise for a certain frequency range. The larger particles give higher permeability because a given mass of ore material is more compact under the conditions as formed in nature than when particles are present and molded with a binder synthetically.

For frequencies around 460 kilocycles, I find that iron particles passing 40 mesh and held back on 60 mesh screens make the best compromise cores. The iron particle size is not very critical over fairly wide ranges of operating frequencies. Thus, cores designed for 460 kc. may also be used for 175 kc., although 30–40 mesh appears to be a somewhat better compromise. Likewise, 60–80 mesh is somewhat better than 40–60 mesh for 1000 kc., and above. A fineness of 325 mesh, or smaller, is desirable for ultra high frequencies of the order of 10,000 kc.

*Binder.*—The binder serves to hold the iron particles together, also as an insulator between magnetic particles, and probably as a lubricant to allow the particles to slide closely together during molding. It should be noted that the same material is used as binder, insulator, and lubricant. For this I prefer to use "Bakelite", a resinous phenol condensation product, preferably starting with uncured Bakelite in powder form and adding a solvent. A synthane Bakelite varnish in liquid form may, if desired, be used. The proportion of binder and iron varies with size of iron particles and molding process. I have found that a mixture in the ratio of one part by volume of binder to fourteen parts of 40–60 mesh magnetite makes satisfactory cores, according to my invention.

*Molding process.*—The preferred molding process consists of: (*a*) Mixing fourteen parts magnetic particles and one part dry Bakelite powder in a mill. (*b*) Adding about four parts of the above mixture, by volume to one part of a liquid solvent such as acetone. As the mixing process is continued, part of the binder solvent will evaporate, and the mass will in time break up and return to a granular mixture, leaving a dry coating of Bakelite insulation on the iron oxide particles; (*c*) Pouring the coated magnetite (like sand) into the hopper of the mold and applying about three tons pressure to the mold for cold molding (Fig. 14); (*d*) Removing the cores, cold molded, and placing in an oven, and curing the cores at 150° C. to 200° C. for about two hours.

The correct pressure used in molding magnetite is an important and critical factor in the production of a core having satisfactory characteristics for radio frequency work, as are some of the other factors involved in my process, as will be seen from the following: Whereas it is desirable to employ a very high pressure in molding in order to increase the density of the magnetic material in order to correspondingly increase the permeability, too great a pressure causes the magnetic particles to break through the insulation material with which it is mixed, resulting in increased eddy current loss. Too low a pressure, and resulting lower density of magnetic particles, produces a permeability that is too low for satisfactory results. I have found, however, that because of the relatively high electrical specific resistance of magnetite as compared to pure iron, a much greater amount of points of electrical contact are allowable between particles without unduly increasing losses. This means that a greater density of material may be used.

If too much binding material is used the excess binder displaces magnetite particles and results in a loss of permeability. On the other hand if too small an amount is used there results a poor insulation between magnetic particles and increases losses.

If the mesh size is too small, there is not enough magnetic material in a given volume, and there is a resulting lowering of permeability. Nature has compressed a maximum amount of magnetic material in a given piece and it appears difficult to duplicate this synthetically by pressing together many fine particles. It is, therefore, desirable, from the point of view of permeability, to employ natural particles as large as possible, compromising with eddy current losses. If the particles are too large the eddy current losses increase for well known reason.

Refering to Fig. 14, I have found that a better core is made by the use of a double and pressure mold. A mold sleeve 95 forms with a base plunger 96 a hopper into which the magnetic mixture is poured for forming the core 59 with the screw insert 17. An upper plunger 97, having a recess to accommodate the screw 17 fits snugly into the upper end of sleeve 95. The sleeve fits snugly around the plungers and is free to move with respect to both plungers as the pressure is applied to the upper end of plunger 97, thereby resulting in a compressed core of uniform density throughout. The inner lining for the shield is made in the same manner as described for the core, with suitable changes made in the mold.

The adjusting screw may be molded in the cores initially, or the cores may be drilled out and the screw inserted, and cemented with a drop of collodion or liquid Bakelite after one hour of heat treatment, followed by a second heat treatment of one hour.

Figure 3:
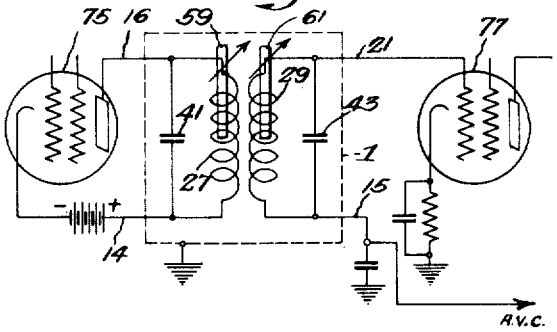

Referring to Fig. 3, I have shown diagrammatically the circuit of my improved intermediate frequency coupling unit with its primary coil 27 connected in the plate circuit of a first detector thermionic tube 75 and with its secondary 29 connected in the input grid of an intermediate frequency amplifier tube 77. In circuits of this nature, it is desirable that capacity coupling between primary and secondary be at a minimum. It has been found that high capacity coupling disturbs the characteristic response curve in some amplifiers. The coils are coupled preferably with optimum coupling. Whereas, in transformer units, heretofore used for circuits of this type, there existed a substantial amount of undesirable coupling between the trimmer condensers mounted side by side on the transformer base. The condensers 41 and 43 are remotely mounted at opposite ends of the unit as shown in Fig. 2 and are, in addition, of substantially smaller size by reason of their being of the fixed, nonadjustable, type.

Figure 1:
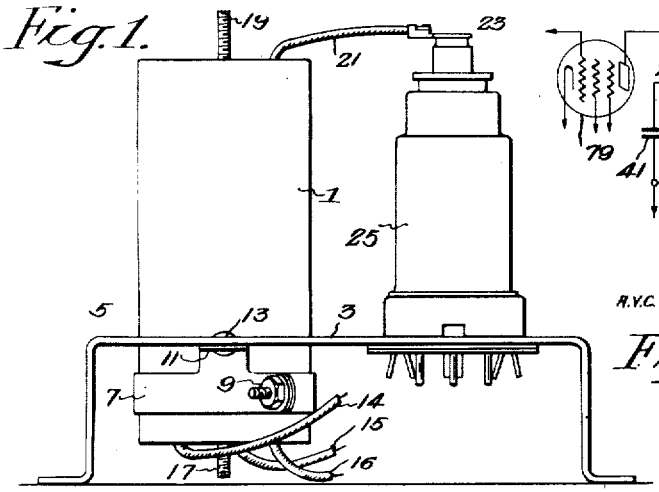
Figure 4:
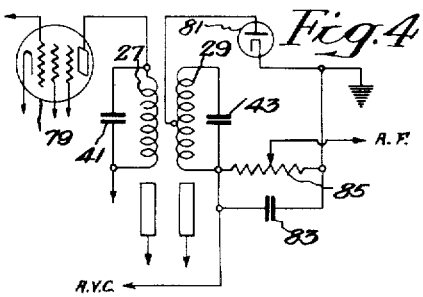
Figs. 3 and 4 are schematic circuit diagrams of portions of a superheterodyne radio system that will serve to illustrate certain applications of my new and improved coupling unit shown in Fig. 2.

Referring to Fig. 4, I have shown diagrammatically an application of my improved coupling unit operatively disposed between the last intermediate frequency amplifier 79 and a diode detector 81. It has been well known for some time that, in using an intermediate diode detector and/or automatic volume control rectifier, with inherent capacity coupling between primary and secondary circuits, that a reduction in the size of the by-pass capacitor 83 in the secondary circuit across the diode load resistor 85 to improve audio fidelity, it is impossible to obtain a satisfactory symmetrical resonance response curve. This condition is made still more unsatisfactory if the diode transformer secondary 29 is tapped, as shown, for the purpose of obtaining greater selectivity by reducing the load on the transformer. I have found that, by reason of my improved construction wherein the condensers 41 and 43 of Fig. 2 are small in dimension and are mounted at remote ends of the unit, the inherent undesired capacity is substantially reduced. Furthermore, bringing the leads out at opposite ends in the manner shown, also reduces the capacity as do other novel features of the design. The result is that a symmetrical resonance response curve is obtained in using my device in the circuit of Fig. 4 even when capacitor 83 is much smaller than used in previous design.

Figure 5:
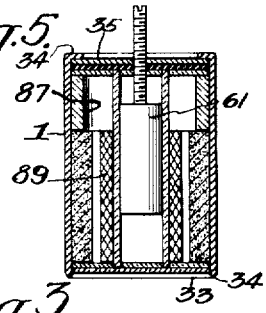
Fig. 5 is a side elevational view, partly in section, of a modified form of my radio frequency coupling unit.

Referring to Fig. 5, I have shown a more simplified device. The inner shield lining of molded magnetite is molded under pressure within the shielding container in close physical and electrical relation, forming therewith a unitary construction, although it is also quite desirable to mold the shield lining separately, as in Fig. 2, and cement it in place, as by collodion. In either case the container and the magnetite comprise contiguous layers of a composite shield. This construction is provided with end support plates 33 and 35 as in the case of Fig. 2, although only one adjustable core of magnetic material is employed. The plate 35 is held in spaced relation by means of a spacer 87 of insulating material, the ends of the shield container being bent over at 34 to secure the parts in place. The coil 89 may represent a single inductor or a primary and secondary respectively of a broadly tuned radio frequency or intermediate frequency transformer wherein the distributed capacity of the coils is used instead of physical condensers as part of the tuned circuit. In some arrangements it is desirable that the secondary be wound over the primary coil to insure maintaining constant coupling regardless of movement of the core. In such a case, the inner layers of coil 89 constitute the primary and the outer circumferential layers the secondary. A structure of this nature may be employed as a diode driving transformer in the circuit of Fig. 4, the condenser 43 being omitted, if desired, from the secondary circuit.

Figure 6:
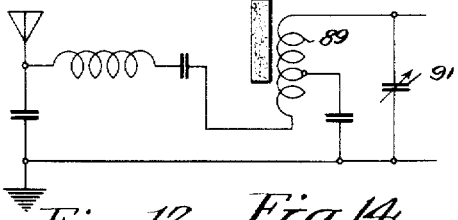
Fig. 6 is a circuit diagram of an antenna input circuit for a radio receiving system that will serve to illustrate one of the uses of the coupling unit shown in Fig. 5.

Fig. 6 represents diagrammatically an antenna input circuit wherein the unit in Fig. 5 may be used to advantage. In this case the core is employed to give a fine adjustment of the inductance of the secondary 89 in order to match its inductance with that of the inductances of succeeding stages adapted to be tuned to the same frequency. It may also be employed to obtain the desired inductance adjustment of coil 89 in relation to the inductance of a superheterodyne oscillator, the tuning condenser of the oscillator being ganged with the tuning condenser 91 in the antenna circuit. Such an arrangement obviates the necessity of adjusting turns, the usual practice as explained in the first part of the specification, besides giving a very substantial increase in the gain of the antenna input circuit due to the lower resistance of the circuit. This arrangement has been found to be particularly useful for application to automobile radio receivers where it is desirable to obtain maximum gain in the antenna circuit.

Figure 10:
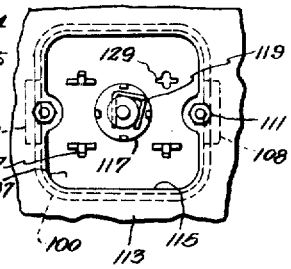
Fig. 10 is a bottom view of the transformer unit of Fig. 9 together with a cut-way section of a chassis on which the unit is mounted.

Referring to Figs. 9 and 10, a modified form of my invention as shown in Fig. 2, the shield container 100 is made square, in section, with rounded corners. The upper end has the edges bent over at 101 to form a flange against which the top insulating support plate 103 abuts. The lower end of the shield is provided with a pair of bolts 105, riveted to the container at 106, for securing a bottom insulating plate 107 in place as well as the entire inside coil assembly, with the aid of nuts 109. The plate 107 lies within the walls of can 100 except for outwardly extending ears 108 which engage cut away sections of the shield as an abutment. The free ends of the bolts, extending beyond the nuts 109, are adapted to protrude through apertures in a radio chassis 113 for securing the unit in place on the chassis, with the aid of nuts 111, in registry with an opening 115 therein for access to terminals and adjusting screw.

A threaded bushing 112, as of brass, is mounted centrally in an opening in each support plate 103 and 107 and is secured in place as by a staking or upsetting operation at 117. The bushings serve to carry the adjusting screws 17 and 19 for the cores. To prevent binding of the cores in the coil support sleeve 31, in case of slight inaccuracies of alignment, the threaded portion of the bushing is limited in length and is remote from the sleeve 31, thereby permitting a little side play. Tight frictional action between the screw 19, for example, and the bushing threads is obtained by means of an angular spring 119 which engages the screw 19 through a slot 121 in the bushing exposing the screw, the back of the bushing, thereby forcing the screw against the threads in one side of the bushing.

The bushings also serve to support the sleeve 31 with a force fit at its ends over shoulders 123, respectively of the bushings. The shoulders are longitudinally knurled at 124 for purposes of giving a tight fit and a strip of paper or fiber 125 is disposed around the sleeve 31 at each end to reinforce it where it is forced on over the shoulders 123.

Terminals 127 are disposed in special apertures 129 in each of the end support plates, and are held in place by deforming laterally the projections 131. The terminals are adapted to have soldered to their inwardly extending portions leads from the inside coils 27 and 29 (Fig. 2), certain of them carry the condensers 41 and 43 as in Fig. 2. External leads 135 are soldered to the external ends of the terminals. A cap 133 is disposed over the upper end of the shield 100 for minimizing capacity coupling to the otherwise exposed terminals on the top of the insulation plate 103.

Referring to Fig. 12, while for production it is desirable to have uniform spacing between coil sections, the inner adjacent sections 28 and 30 of primary and secondary coils 27 and 29 may be spaced a greater amount from their other associated coil sections in order to further increase the independence of adjustment of the self inductances with respect to coupling which it is value. This permits of a greater insertion of the core into the remaining coil sections without exceeding the permissible effect upon coupling between primary and secondary. It is desirable that the adjacent coil sections 28 and 30 be at the low radio frequency potential ends of the primary and secondary, respectively, to reduce capacity coupling. The same is true of Fig. 2.

A further desirable modification of my invention is illustrated in Fig. 12. A coupling coil 34 of a few number of turns, is wound between the first and second sections, at the high radio frequency potential end of the primary coil. For this position it can be seen that the mutual coupling between the primary coil 27 and the coupling coil 34, will remain unchanged while the molded core is moved over the working range as shown in Fig. 11a. In accordance with the teachings of Carlson Patent 1,871,405, a switch means 36 is provided for throwing the coil 34 in or out of the circuit to control broadness of the resonance curve of the transformer circuit. A suitable value of resistance 38 is provided in series with the coupling coil, as in the Carlson patent, to prevent double peaked response curve.

Carrying this feature further to obtain a maximum independence of inductance adjustment by cores 59 and 61 with respect to the coupling, I have shown in Fig. 13, coupling coil sections 28 and 30 magnetically isolated from the remaining sections. They are coupled together, and are preferably provided with an auxiliary core 60 which may be adjustable. The coupling between circuits is determined mainly by sections 28 and 30 which may be isolated by placing them in a separate shield, or more inexpensively, in the same container but mounted at right angles as indicated.

I claim as my invention:

1. In a radio frequency transformer comprising an elongated shield housing, and magnetic means therefor, a pair of coupled inductors in said housing having adjusting members extending beyond the opposite ends respectively of said housing for individual inductance adjustment of said inductors, said adjusting members having substantially no effect on the coupling between said inductors.

2. In a resonant high frequency coupling unit, an inductor, a core of molded magnetic granular material, a shield housing closely disposed around said inductor, means carried by said housing for supporting said core for adjustment within said inductor, said housing comprising an outer sheath of sheet metal and an inner layer of molded paramagnetic material interposed between said inductor and sheath and characterized by low eddy current losses, whereby the factor of merit of said inductor is increased over what it would be in the absence of said inner layer and said core.

3. The invention as set forth in claim 2 characterized in that said inner layer of magnetic material is molded in close physical and electrical relation with said metal sheath.

4. A radio frequency coupling device comprising a plurality of inductive reactance elements including adjustable cores of comminuted magnetic material, an elongated electrical shield housing surrounding said elements, a plurality of circuit conductors, including an input and an output terminal of high radio frequency potential and at least one low radio frequency potential terminal for connecting said elements with radio apparatus external to said shield, said input and output terminals being disposed at opposite ends respectively of said shield housing for reduction of capacity coupling.

5. The invention as set forth in claim 4 further characterized by the fact that means for adjusting the positions of said cores with respect to said reactance elements are provided at each end of said housing.

6. A radio frequency coupling device comprising an elongated shield housing, support means carried at opposite ends of said housing, a tubular sleeve coaxially suspended in said housing between said support means, a reactor disposed around said sleeve, a core of magnetic material disposed within said sleeve and arranged for movement to vary the inductance of said reactor, a bushing carried by one of said support means, said bushing being provided with means for adjusting the position of said core and with structure for engaging an end of said sleeve in supporting relation therewith.

7. The invention as set forth in claim 6 further characterized by the fact that a similar bushing is carried by the other of said support means, and said support structure on said bushing consists of an annular shoulder for engaging the ends of said sleeve.

8. The invention as set forth in claim 2 further characterized in that said inner layer of magnetic material is insulated electrically from said metal sheath.

9. In a radio frequency coupling device, a tuning inductor, a shield housing surrounding said inductor, said housing comprising an outer sheath of sheet metal, an inner layer of comminuted paramagnetic material, and means for electrically insulating said sheath from said layer of magnetic material.

10. The invention as set forth in claim 9 further characterized by the fact that said inductor is provided with an adjustable magnetic core, said core and said sheath of magnetic material being of a high resistance magnetic oxide.

11. A coil system for radio apparatus comprising an inductor, a composite metal shield surrounding said inductor, and an inner shield of comminuted paramagnetic material disposed between said inductor and said metal shield and relatively closer spaced to the latter over a substantial area, whereby the factor of merit of said inductor is increased over what it would be in the absence of said second named shield.

12. The invention as set forth in claim 11 characterized in that said inner shield is of high specific resistance relative to said metal shield.

13. The invention as set forth in claim 11 characterized in that said inner shield comprises a magnetic oxide of iron.

14. In a radio frequency coupling device, a tuning inductor, a composite shield housing surrounding said inductor, said housing comprising an outer sheath of sheet metal, an inner layer of comminuted paramagnetic material, said sheath and said layer being connected together in close physical and electrical relation over a substantial area.

15. In a high frequency coupling device, an inductor, a composite electrical shield disposed in magnetic relation to said inductor, said shield comprising a layer of sheet metal on the side remote from said inductor and a contiguous layer of comminuted paramagnetic material on the side of said shield adjacent to but relatively spaced substantially from said inductor.

16. A coil system for radio apparatus comprising an inductor, a laminated shield adjacent said inductor and comprising a layer of sheet metal and a relatively high resistance layer of comminuted paramagnetic material disposed between said inductor and said sheet metal layer, whereby the factor of merit of said inductor is increased over what it would be in the absence of said second named layer.

17. In a high frequency coupling device, a composite shield comprising a layer of comminuted paramagnetic material characterized by high resistance to current flow and being highly effective as an electromagnetic shield, and a relatively low resistance metal layer disposed in contiguous relation therewith over a substantial area, said metal layer being grounded for effective electrostatic shielding.

18. A radio frequency resonant circuit device comprising a tubular sheet metal housing, support means disposed at opposite ends of said housing, a tubular sleeve centrally disposed in said housing with its ends supported by said means, primary and secondary coils disposed in end-to-end coupled relation along said sleeve in coaxial relation, a magnetic core for one of said coils disposed within the bore of said sleeve, and a rod engaging an end of said core and extending through one of said support means for external adjustment of said core through a limited extent of said one of said coils for individually adjusting the inductance thereof without substantially changing the coupling between said coils.

19. A radio frequency resonant circuit device comprising a tubular sheet metal housing, support means disposed at opposite ends of said housing, a tubular sleeve centrally disposed in said housing with its ends supported by said means, primary and secondary coils disposed in end-to-end coupled relation along said sleeve in coaxial relation, a magnetite core for each of said coils disposed within the bore of said sleeve, and means for separate and independent adjustment of said cores extending through said support means respectively, for external adjustment of the self-inductances of said coils respectively.

20. A radio frequency resonant circuit device comprising a tubular sheet metal housing, support means disposed at opposite ends of said housing, a tubular sleeve centrally disposed in said housing with its ends supported by said means, primary and secondary coils disposed in end-to-end coupled relation along said sleeve in coaxial relation, a core for one of said coils disposed within the bore of said sleeve, and a rod engaging the end of said core and extending through one of said support means for external adjustment of said core relative to said one of said coils, said coils comprising spaced groups of turns, so arranged that the adjacent group of each primary and secondary coil is at low radio frequency potential for reducing capacity coupling.

21. A radio frequency resonant circuit device comprising a tubular sheet metal housing, support means disposed at opposite ends of said housing, a tubular sleeve centrally disposed in said housing with its ends supported by said means, primary and secondary coils disposed in end-to-end coupled relation along said sleeve in coaxial relation, a core for one of said coils disposed within the bore of said sleeve, and a rod engaging the end of said core and extending through one of said support means for external adjustment of said core relative to said one of said coils, and fixed reactive elements, one for tuning said primary and one for tuning said secondary coil respectively, carried by said support means at remote ends of said housing whereby capacity coupling between elements of primary and secondary is reduced.

ROBERT L. HARVEY.